US008524526B1

(12) United States Patent
Krasnov

(10) Patent No.: US 8,524,526 B1
(45) Date of Patent: Sep. 3, 2013

(54) ORGANIC LIGHT EMITTING DIODE WITH TRANSPARENT ELECTRODE AND METHOD OF MAKING SAME

(75) Inventor: Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 13/585,001

(22) Filed: Aug. 14, 2012

(51) Int. Cl.
*H01L 51/54* (2006.01)
*H01L 51/56* (2006.01)

(52) U.S. Cl.
USPC ............... 438/99; 438/104; 257/40; 136/256

(58) Field of Classification Search
None
See application file for complete search history.

(56) References Cited

U.S. PATENT DOCUMENTS

| | | | |
|---|---|---|---|
| 7,041,588 B2 * | 5/2006 | Bender | 438/608 |
| 7,601,436 B2 | 10/2009 | Djurovich et al. | |
| 7,629,741 B2 | 12/2009 | Liao et al. | |
| 7,659,661 B2 | 2/2010 | Park | |
| 7,662,663 B2 | 2/2010 | Cok et al. | |
| 7,663,311 B2 | 2/2010 | Im et al. | |
| 7,663,312 B2 | 2/2010 | Anandan | |
| 8,022,291 B2 * | 9/2011 | Thomsen et al. | 136/256 |
| 2009/0295283 A1 | 12/2009 | Kim et al. | |
| 2010/0304523 A1 * | 12/2010 | Broadway et al. | 438/72 |
| 2010/0311204 A1 * | 12/2010 | Komin et al. | 438/98 |
| 2011/0168252 A1 * | 7/2011 | Krasnov et al. | 136/256 |
| 2011/0193477 A1 | 8/2011 | Lifka et al. | |
| 2012/0107554 A1 * | 5/2012 | Pfaff et al. | 428/141 |
| 2012/0167971 A1 * | 7/2012 | Krasnov et al. | 136/256 |

OTHER PUBLICATIONS

U.S. Appl. No. 13/585,149, filed Aug. 14, 2012, Krasnov.
U.S. Appl. No. 13/064,063, filed Mar. 3, 2011; Imran et al.
U.S. Appl. No. 13/064,062, filed Mar. 3, 2011; Imran et al.
U.S. Appl. No. 13/488,779, filed Jun. 5, 2012; Veerasamy.

* cited by examiner

*Primary Examiner* — Thomas L Dickey
*Assistant Examiner* — Joseph Schoenholtz
(74) *Attorney, Agent, or Firm* — Nixon & Vanderhye P.C.

(57) ABSTRACT

A transparent electrode is provided for an organic light emitting diode (OLED) device. In certain embodiments, the electrode is made by sputter-depositing first and second transparent conductive oxide (TCO) layers of the same material (e.g., ITO), but with different stoichiometries, on a substrate. The first TCO layer is more oxided than is the second TCO layer. The TCO layers of the electrode on the substrate may then be heat treated (HT) at high temperature(s) in order to increase the work function (WF) and/or increase visible transmission of the electrode. The electrode is provided in an OLED device.

33 Claims, 3 Drawing Sheets

ORGANIC LIGHT EMITTING DIODE WITH TRANSPARENT ELECTRODE AND METHOD OF MAKING SAME

Certain example embodiments relate to improved organic light emitting diode (OLED) devices, and/or methods of making the same. In particular, certain embodiments of this invention relate to a transparent electrode for an OLED device, and methods of making the same. In certain example embodiments, the electrode is made by sputter-depositing on a substrate first and second transparent conductive oxide (TCO) layers of the same material with different respective stoichiometries. The first TCO layer is located between the substrate and the second TCO layer. The first TCO layer is more oxided than is the second TCO layer, while both are of the same material or substantially the same material. The TCO layers on the substrate may then be heat treated (HT) at high temperature(s) in order to increase its work function (WF) and/or increase visible transmission and electrical conductivity of the electrode to be used in an OLED.

BACKGROUND AND SUMMARY OF EXAMPLE EMBODIMENTS

An organic light emitting diode (OLED) is a light-emitting diode (LED) in which the emissive electroluminescent layer(s) is a film of or based mainly on organic compounds which emit light in response to an electric current. This layer of organic semiconductor material is situated between two electrodes in some cases. Generally, for example, at least one of these electrodes is transparent. OLEDs sometimes are used in television screens; computer monitors; small or portable system screens such as those found on mobile phones and PDAs; and/or the like. OLEDs may also sometimes be used in light sources for space illumination and in large-area light-emitting elements. OLED devices are described, for example, U.S. Pat. Nos. 7,663,311; 7,663,312; 7,662,663; 7,659,661; 7,629,741; 7,601,436, 2011/0193477, and 2009/0295283, the entire contents of all of which are hereby incorporated herein by reference.

A typical OLED comprises at least two organic layers—e.g., electron and hole transport layers—that are embedded between two electrodes. One electrode typically is made of a reflective metal. The other electrode typically is a transparent conductive layer supported by a glass substrate. The one electrode generally is the cathode, and the other electrode generally is the anode. Indium tin oxide (ITO) often is used at the front portion of the OLED as the anode.

FIG. 1 is an example cross-sectional view of a typical OLED. The OLED includes glass substrate 102, transparent conductive anode layer 104, organic layer 100, cathode layer 110 and cover glass 112. The organic light emission layer 100 emits light, and light is generated by processes known from conventional OLEDs when electrons and holes injected into the organic layer 100 from different sides recombine. The organic layer 100 may include multiple layers. For example, in certain example instances the organic layer 100 may include a hole injection layer, a hole transport layer, a light-emitting layer, an electron transport layer, and an electron injection layer. An example shown in FIG. 1 illustrates the organic semiconductor layer 100 including a hole transport layer (HTL), and electron transport layer (ETL), and an emitting layer, where the ETL and emitting layer may or may not be present in one layer.

When a voltage is applied to the electrodes 104 and 110, the charges start moving in the device under the influence of the electric field. Electrons leave the cathode, and holes move from the anode in opposite direction. For example, the recombination of these charges leads to the creation of photons with frequencies given by an energy gap between LUMO and HOMO levels of the emitting molecules, so that the electrical power applied to the electrodes is transformed into light. Different materials and/or dopants may be used to generate different colors, with the colors being combinable to achieve yet additional colors.

This disclosure relates to an improved electrode on the light-emitting side of the organic layer, for use in an OLED device or the like. For example, referring to the OLED in FIG. 1, this disclosure relates to an improved electrode 104 on the light emitting side of the organic layer 100 and a method of making the same.

In certain example embodiments of this invention, the electrode is made by depositing first and second successive transparent conductive oxide (TCO) layers of the same material (e.g., indium-tin-oxide; a/k/a ITO) with different respective stoichiometries. The first and second TCO layers are deposited (directly or indirectly) on a substrate (e.g., glass substrate), and may be deposited for example via sputtering at approximately room temperature. Sputter deposition without intentional heating of the substrate offers certain cost advantages due, primarily, to the lower capital, lower maintenance and higher deposition rates. At the same time, additional post-deposition heating of the TCO is usually used to optimize its optical and electrical performance. High temperatures of post-deposition heating allow better TCO properties. At ~350-500 C, however, the room temperature deposited ITO abruptly loses its conductivity when heated in air, unless its stoichiometry is substantially sub-oxided (a lack of oxygen in the TCO composition). The properties of the sub-oxided ITO, however, are not optimum after the heat treatment. To achieve the benefits of high-temperature post-deposition heat treatment while avoiding the conductivity loss, example embodiments of this invention introduce at least a double-layer TCO, where the second layer serves as a protection to the first layer optimized for the best TCO performance after the heat treatment. The first TCO layer is located between the substrate and the second TCO layer, and the first TCO layer is more oxided as deposited than is the second TCO layer as deposited, while both are of the same material or substantially the same material. In certain example embodiments, as deposited, the first TCO layer contains at least about 5% more oxygen, more preferably at least about 10% more oxygen, even more preferably at least about 20% more oxygen, and most preferable at least about 30% more oxygen, than does the second TCO layer. The TCO layers of the electrode on the substrate may then be heat treated (HT) at high temperature(s) in order to (a) activate the electrode for desired electrical and/or optical properties, (b) increase the work function (WF) of the electrode, and/or (c) increase visible transmission of the electrode.

In certain example embodiments of this invention, there is provided a method of making an electrode for use in an organic light emitting diode (OLED) device, the method comprising: sputter-depositing a first layer comprising indium tin oxide (ITO) on a glass substrate; sputter-depositing a second layer comprising ITO on the glass substrate over and directly contacting the first layer comprising ITO to form an electrode structure, so that the first layer comprising ITO is located between at least the substrate and the second layer comprising ITO in the electrode structure, wherein as sputter-deposited the first layer comprising ITO is more oxided than is the second layer comprising ITO; and heat treating the electrode structure including the glass substrate and the first and second layers comprising ITO at temperature(s) of at least about 400 degrees C. in order to increase work function of ITO in the electrode structure and increase visible transmission of the electrode structure. As sputter-deposited, the first layer comprising ITO may contain at least 5% more oxygen, more preferably at least 10% more oxygen, still more preferably at least 20% more oxygen, and even more preferably at least 30% more oxygen (by mol %), than the second layer comprising ITO.

In certain embodiments of this invention, there is provided a method of making an electrode for use in an organic light emitting diode (OLED) device, the method comprising: sputter-depositing a first layer comprising metal oxide on a substrate; sputter-depositing a second layer comprising metal oxide on the substrate over and directly contacting the first layer comprising metal oxide to form an electrode structure, wherein the same metal oxide is in both the first and second layers comprising metal oxide, but as sputter-deposited the first layer comprising metal oxide is more oxided than is the second layer comprising metal oxide; and heat treating the electrode structure including the substrate and the first and second layers comprising metal oxide at temperature(s) of at least about 400 or 500 degrees C. in order to increase work function of ITO in the electrode structure and increase visible transmission of the electrode structure. The substrate may comprise glass or quartz, and the metal oxide may be or comprise ITO, or alternatively the metal oxide may be another suitable metal oxide.

In certain embodiments of this invention, there is provided an organic light emitting diode (OLED) comprising: a transparent conductive electrode structure comprising first and second layers comprising the same metal oxide (e.g., ITO) on a substrate (e.g., glass or quartz substrate), the first layer comprising the metal oxide being located between the substrate and the second layer comprising the metal oxide, and wherein the second layer comprising the metal oxide directly contacts the first layer comprising the metal oxide; wherein the same metal oxide is in both the first and second layers comprising the metal oxide, and wherein the first layer comprising the metal oxide is more oxided than is the second layer comprising the metal oxide; and an organic light emitting layer located between said transparent conductive electrode structure and another electrode, and wherein said transparent conductive electrode structure is on a light emitting side of the organic light emitting layer.

In certain embodiments of this invention, there is provided an organic light emitting diode (OLED) comprising: an organic light emitting layer located between a transparent conductive electrode structure and another electrode, and wherein said transparent conductive electrode structure is on a light emitting side of the organic light emitting layer; and wherein said transparent conductive electrode structure includes a film comprising a metal oxide (e.g., ITO), wherein said film comprising the metal oxide includes a first portion and a second portion, the first portion being more oxided than the second portion and being farther from the organic light emitting layer than the second portion. In certain example embodiments, the first portion may contain at least 5% (more preferably at least 10%, even more preferably at least 20% or 30%) more oxygen than the second portion. The film comprising the metal oxide may be oxidation graded, continuously or discontinuously, so as to be more oxided farther from the organic light emitting layer.

These and other embodiments, features, aspect, and advantages may be combined in any suitable combination or sub-combination to produce yet further embodiments.

BRIEF DESCRIPTION OF THE DRAWINGS

These and other features and advantages may be better and more completely understood by reference to the following detailed description of exemplary illustrative embodiments in conjunction with the drawings, in which like reference numerals indicate like parts throughout the several views, of which.

DETAILED DESCRIPTION OF CERTAIN EXAMPLE EMBODIMENTS

Certain embodiments of this invention relate to a design and method of making a transparent electrode (contact) (e.g., of or including ITO) with an electrically active surface, which may be deposited at approximately room temperature and which may be activated by post-deposition heat treatment (HT). A substantially sub-oxided ITO layer 20 is initially deposited (e.g., via sputtering) over an optimized ITO layer 10. The protective sub-oxided ITO layer 20 serves as an oxygen blocking layer to prevent the layer 10 from becoming overly oxidized during HT, thereby permitting the layer 10 to be exposed to high temperatures for improving electrical and optical properties without suffering undesirable defects.

ITO deposited at room temperature typically is thermally activated for optimal electrical and optical properties. If the activation temperature exceeds about 370 degrees C., the electrical conductivity tends to decrease due to formation of native defects caused by over-oxidation of the ITO. However, temperatures higher than 370 degrees C. are needed for optimal ITO performance (e.g., to achieve desired conductivity, work function, and/or transparency). It is known to bake the ITO in a vacuum in an effort to prevent over-oxidation (excessive oxidation), or to try to protect the ITO with a dielectric layer to block oxygen. However, the simple baking in vacuum approach adds significantly to the cost and tends to slow down the manufacturing process, whereas simply protection by a dielectric layer introduces a non-conductive surface which can be problematic for applications such as OLEDs or electrochromic devices. A simple sub-oxided ITO layer has been attempted, being oxided to the same extent throughout the layer, but in this case optimal ITO properties could not be achieved. Thus, in certain embodiments of this invention, a substantially sub-oxided ITO layer 20 is deposited from a metallic InSn target on top of an optimal ITO layer deposited using a ceramic ITO target which is optimized for post-deposition thermal activation. The stoichiometry and thickness of both ITO layers is optimized in such a way as to reach to desired optimum following HT. The most controllable ITO sputter deposition process can be achieved via a ceramic ITO target, which often does not permit deposition of a substantially sub-oxided ITO layer. The stoichiometry of the ITO 10 closest to the substrate 102 is optimized, via ceramic target sputtering, to ensure optimal ITO performance upon baking, while the top ITO layer 20 is more sub-oxidized to protect layer 10 during HT (e.g., to ensure effective oxygen properties so that the ITO layer 10 is not overly oxidized during the HT).

Figure 1:
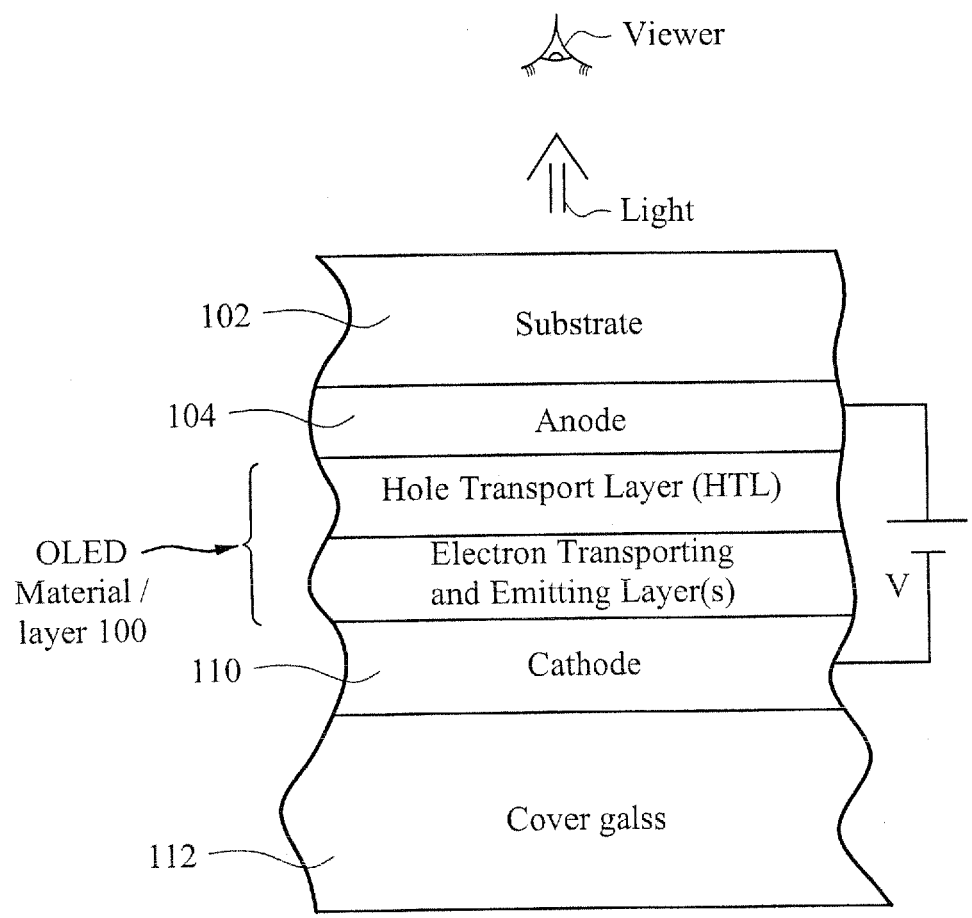
FIG. 1 is an example cross-sectional view of an OLED.
Figure 2:
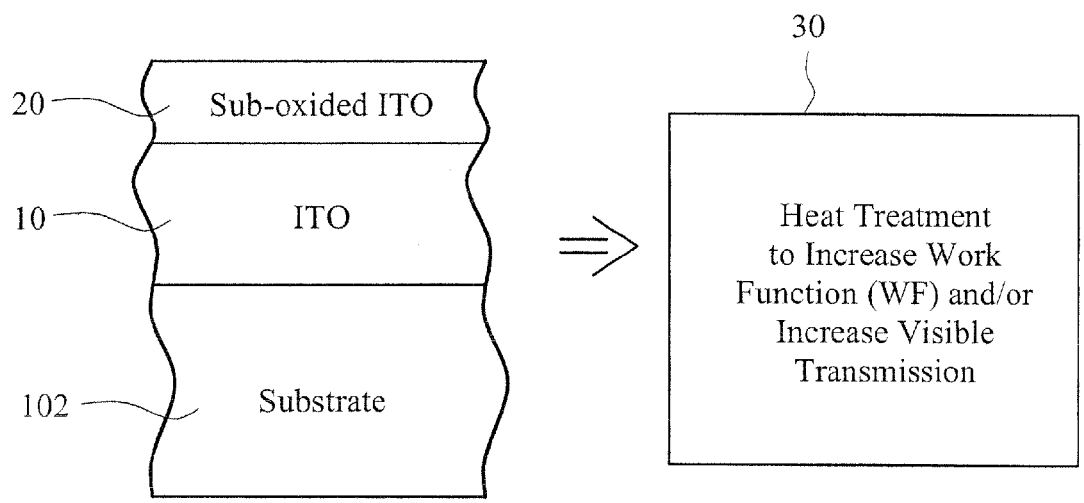
FIG. 2 is a schematic diagram of a technique for making a transparent electrode for an OLED according to an example embodiment of this invention.
Figure 3:
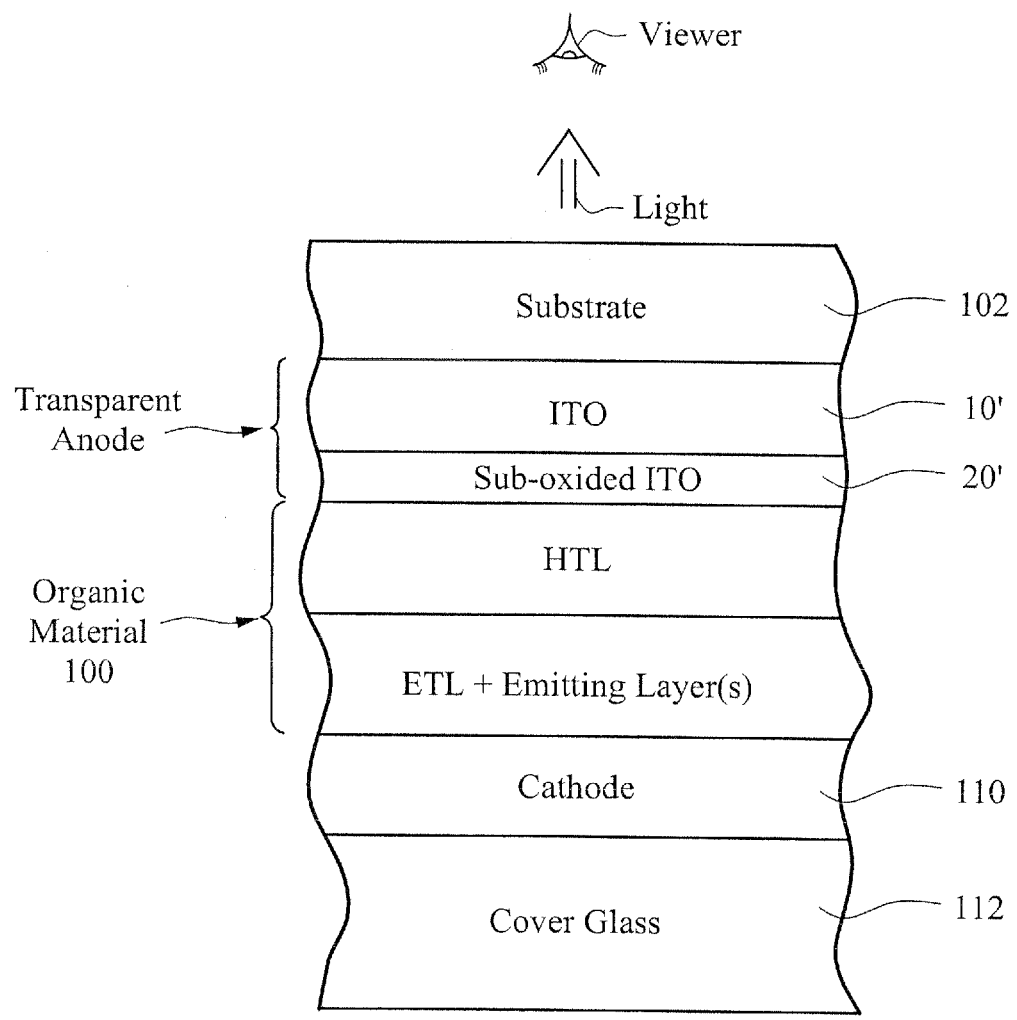
FIG. 3 is a cross-sectional view of an OLED, including the transparent electrode of FIG. 2, according to an example embodiment of this invention.

Referring generally to FIGS. 2-3, in certain example embodiments of this invention there is provided a method of making an electrode for use in an organic light emitting diode (OLED) device, the method comprising: sputter-depositing a first layer 10 of or including indium tin oxide (ITO) on a glass substrate 102; sputter-depositing a second layer 20 of or including ITO on the transparent glass substrate 102 over and directly contacting the first layer 10 comprising ITO to form an electrode structure. The first layer 10 of or including ITO is located between at least the substrate 102 and the second layer 20 of or including ITO in the electrode structure. In certain example embodiments, as sputter-deposited (e.g., at approximately room temperature where the substrate 102 and layers 10, 20 are all at approximately room temperature, or alternatively at an elevated temperature such as from about 30-60 degrees C.), the first layer 10 of or including ITO is more oxided than is the second layer 20 of or including ITO. After the two layers 10 and 20 of or based on ITO are sputter-deposited on (directly or indirectly) the substrate, the layers on the substrate are heat treated (HT) 30 at temperature(s) of at least about 400 degrees C. (more preferably at least about 500 degrees C., still more preferably at least about 550 degrees C. and even more preferably at least about 600 degrees C.) in order to increase work function of ITO 10 and/or 20 in the electrode structure and increase visible transmission of the electrode structure. In OLED application, a high work function (WF) is desired on the side of the ITO facing the viewer. The heat treatment may be performed for a time period sufficient to allow the bulk ITO to reach about 550 or 600 degrees C., for at least about 20 or 30 seconds, so as to achieve a desired increase in WF due to the HT in certain example embodiments. During heat treating, in certain example embodiments, the second ITO layer 20 is the uppermost and exposed layer of the coating on substrate 102. Accordingly, by using the two layer 10, approach, where the upper ITO layer 20 is sub-oxided compared to the first ITO layer 10, the work function of the post-HT ITO electrode can be increased and the resulting electrode can be made to be more transparent and more conductive without suffering from significant defects.

While the substrate 102 may be of or including glass in preferred embodiments, it is also possible that the substrate may be of a different transparent material such as quartz in alternative embodiments.

As sputter-deposited and possibly after HT, the first layer 10 of or including ITO may contain at least 5% more oxygen (more preferably at least 10% more oxygen, still more preferably at least 20% more oxygen, and even more preferably at least 30% more oxygen, than the second layer 20 of or including ITO. The first layer 10 of or including ITO may be thicker (e.g., at least 50 nm thicker, most preferably at least about 100 nm thicker) than the second layer 20 of or including ITO.

In certain example embodiments, sputter-depositing of the first ITO layer 10 may be performed by sputtering a ceramic target of or including indium, tin and oxygen (e.g., with In/Sn molar ratio in the target and in the layer from 80/20 to 95/5), whereas sputter-depositing of the second ITO layer 20 may be performed by sputtering a metallic or substantially metallic target of or including indium and tin (e.g., InSn target) with a argon/oxygen gas ratio of from about 4:1 to 1:1. An example InSn target may have an In/Sn molar ratio of from 80/20 to 95/5. Thus, in certain embodiments, the first and second ITO layers 10 and 20 may be sputter-deposited using different types of targets in order to ensure the that the second layer is less oxided and to allow the oxidation values to be better controlled. Alternatively, the second ITO layer 20 may be sputter-deposited using a ceramic ITO target (e.g., with In/Sn molar ratio in the target and in the layer from 80/20 to 95/5), with the deposition being performed in a reduced atmosphere using a mixture of Ar and $H_2$ gas (e.g., from about 1-10%, more preferably about 5% $H_2$).

The first ITO layer 10 may be from about 50-500 nm thick, more preferably from about 100-200 nm thick (e.g., about 150 nm thick), and the second ITO layer 20 may be from about 20-500 nm thick, more preferably from about 20-95 nm thick (e.g., about 50 nm thick). While only two ITO layers are shown in FIG. 2, this invention is not so limited and more than two ITO layers may be provided. For example, there may be three or four ITO layers in certain example embodiments, where generally the layer(s) closer to the substrate 102 are more oxided than are the layer(s) farther from the substrate 102.

While FIG. 2 illustrates ITO layer 10 and 20 as different "layers," in certain example embodiments of this invention, they may be combined into a single oxidation graded layer that is oxidation graded, continuously or discontinuously, so that portion(s) closer to substrate 102 are more oxided than are portions farther from substrate 102. The single layer in such graded embodiments may, for example, be deposited by varying gas flows around one or more targets (e.g., using more oxygen glass flow in the initial part of the sputter-depositing where the portion(s) closer to substrate 102 is formed, and then reducing the amount of oxygen gas in the sputtering chamber(s) later in the process when the portion(s) of the layer farther form substrate 102 is formed.

After the heat treating 30, the electrode structure (e.g., including the substrate 102 and the heat treated first and second ITO layers 10' and 20') may have a visible transmission of at least about 75%, more preferably of at least about 80%, and most preferably of at least about 82 or 84%. Moreover, after the heat treating, the heat treated electrode (e.g., layer 10' and/or layer 20') may have a specific resistivity of less than or equal to about 0.30 mOhms-cm, more preferably less than or equal to about 0.27 mOhms-cm.

After the heat treating 30, the electrode structure described above (e.g., including the heat treated first and second ITO layers 10' and 20', and optionally the substrate 102) is provided in an OLED device as shown in FIG. 3 so that an organic semiconductor film/layer 100, including an organic light emitting semiconductor layer, is located between the electrode structure and another electrode 110. For example, the organic film/layer 100 and cathode 110 may be formed on substrate 102 over the ITO electrode. The organic film/layer 100 emits light, and light is generated when electrons and holes injected into the organic film/layer 100 from different sides recombine. The organic film/layer 100 may include multiple layers, but always includes at least one light emitting layer. For example, in certain example embodiments, organic film/layer 100 may include a hole injection layer, a hole transport layer, a light-emitting layer, an electron transport layer, and an electron injection layer. An example shown in FIG. 3 illustrates the organic semiconductor film/layer 100 including a hole transport layer (HTL), and electron transport layer (ETL), and an emitting layer, where the ETL and emitting layer may or may not be present in one layer. When a voltage is applied to the electrodes 10', 20' and 110, the charges start moving in the device under the influence of the electric field. Electrons leave the cathode 110, and holes move from the anode 10', 20' in opposite direction, so that the electrical power applied to the electrodes is transformed into light. FIG. 3 illustrate that the electrode 110 is a cathode, and the transparent electrode made up of the ITO is the anode, however the "cathode" and "anode" may be reversed in certain example embodiments so that the cathode is transparent and made up of the ITO layers 10' and 20'.

In certain example embodiments, in one or more steps not shown, CRI matching layers, antireflective (AR) coatings, and/or the like may be provided in the OLED device. For example, an AR layer(s) may be provided either between the layer 10 and substrate 102, or on the major surface of substrate opposite the ITO 10, 20. In certain example embodiments, a layer of or including silicon nitride and/or silicon oxide may be provided between the substrate 102 and the ITO layer 10.

And although certain example embodiments have been described in connection with ITO being used as the metal oxide for the transparent electrode made up of 10' and 20', it will be appreciated that other conductive oxide materials may be used in place of ITO. Alternate materials may include, for example, zinc oxide, aluminum-doped zinc oxide (AZO), indium gallium zinc oxide (IGZO), etc.

These techniques similarly may be used in inorganic light emitting diodes (ILEDs), polymer light emitting diode (PLEDs), and/or other diode applications.

In certain example embodiments of this invention, there is provided a method of making an electrode for use in an organic light emitting diode (OLED) device, the method comprising: sputter-depositing a first layer comprising indium tin oxide (ITO) on a glass substrate; sputter-depositing a second layer comprising ITO on the glass substrate over and directly contacting the first layer comprising ITO to form an electrode structure, so that the first layer comprising ITO is located between at least the substrate and the second layer comprising ITO in the electrode structure, wherein as sputter-deposited the first layer comprising ITO is more oxided than is the second layer comprising ITO; and heat treating the electrode structure including the glass substrate and the first and second layers comprising ITO at temperature(s) of at least about 400 degrees C. in order to increase work function of ITO in the electrode structure and increase visible transmission of the electrode structure.

In the method of the immediately preceding paragraph, the first and second layers comprising ITO may consist essentially of ITO.

In the method of any of the preceding two paragraphs, as sputter-deposited, the first layer comprising ITO may contain at least 5% more oxygen, more preferably at least 10% more oxygen, still more preferably at least 20% more oxygen, and even more preferably at least 30% more oxygen (by mol %), than the second layer comprising ITO.

In the method of any of the preceding three paragraphs, said heat treating may comprise heat treating the electrode structure including the glass substrate and the first and second layers comprising ITO thereon at temperature(s) of at least about 500 degrees C., more preferably of at least about 550 or 600 degrees C.

In the method of any of the preceding four paragraphs, said sputter-depositing of the first layer comprising ITO and said sputter-depositing of the second layer comprising ITO may each comprise sputter-depositing at approximately room temperature.

In the method of any of the preceding five paragraphs, said first layer comprising ITO may be sputter-deposited on the glass substrate so as to directly contact the glass substrate.

In the method of any of the preceding six paragraphs, the first layer comprising ITO may be thicker (e.g., at least 50 nm thicker, most preferably at least about 100 nm thicker) than the second layer comprising ITO.

In the method of any of the preceding seven paragraphs, said sputter-depositing of the first layer comprising ITO may comprise sputtering a ceramic target comprising indium, tin and oxygen; and said sputter-depositing of the second layer comprising ITO may comprise sputtering a metal target comprising indium and tin.

In the method of any of the preceding eight paragraphs, the first layer comprising ITO may be from about 100-200 nm thick, and/or the second layer comprising ITO may be from about 20-95 nm thick.

In the method of any of the preceding nine paragraphs, after said heat treating, the electrode structure may have a visible transmission of at least about 80%.

In the method of any of the preceding ten paragraphs, after said heat treating, the electrode structure may be provided in an OLED device so that an organic light emitting semiconductor layer is located between said electrode structure and another electrode.

In certain embodiments of this invention, there is provided a method of making an electrode for use in an organic light emitting diode (OLED) device, the method comprising: sputter-depositing a first layer comprising metal oxide on a substrate; sputter-depositing a second layer comprising metal oxide on the substrate over and directly contacting the first layer comprising metal oxide to form an electrode structure, wherein the same metal oxide is in both the first and second layers comprising metal oxide, but as sputter-deposited the first layer comprising metal oxide is more oxided than is the second layer comprising metal oxide; and heat treating the electrode structure including the substrate and the first and second layers comprising metal oxide at temperature(s) of at least about 400 or 500 degrees C. in order to increase work function of ITO in the electrode structure and increase visible transmission of the electrode structure.

In the method of the immediately preceding paragraph, the substrate may comprise glass or quartz.

In the method of the immediately preceding paragraph, the metal oxide may be or comprise ITO.

In certain embodiments of this invention, there is provided an organic light emitting diode (OLED) comprising: a transparent conductive electrode structure comprising first and second layers comprising the same metal oxide on a substrate, the first layer comprising the metal oxide being located between the substrate and the second layer comprising the metal oxide, and wherein the second layer comprising the metal oxide directly contacts the first layer comprising the metal oxide; wherein the same metal oxide is in both the first and second layers comprising the metal oxide, and wherein the first layer comprising the metal oxide is more oxided than is the second layer comprising the metal oxide; and an organic light emitting layer located between said transparent conductive electrode structure and another electrode, and wherein said transparent conductive electrode structure is on a light emitting side of the organic light emitting layer.

In the OLED of the immediately preceding paragraph, the substrate comprise glass or quartz.

In the OLED of any of the preceding two paragraphs, the metal oxide may be ITO.

In the OLED of any of the preceding three paragraphs, the first layer comprising the metal oxide may contain at least 5% (more preferably at least 10%, even more preferably at least 20%) more oxygen than the second layer comprising the metal oxide.

In certain embodiments of this invention, there is provided an organic light emitting diode (OLED) comprising: an organic light emitting layer located between a transparent conductive electrode structure and another electrode, and wherein said transparent conductive electrode structure is on a light emitting side of the organic light emitting layer; and wherein said transparent conductive electrode structure includes a film comprising a metal oxide (e.g., ITO), wherein said film comprising the metal oxide includes a first portion and a second portion, the first portion being more oxided than the second portion and being farther from the organic light emitting layer than the second portion.

In the OLED of the immediately preceding paragraph, the first portion may contain at least 5% (more preferably at least 10%, even more preferably at least 20% or 30%) more oxygen than the second portion.

In the OLED of any of the preceding two paragraphs, the film comprising the metal oxide may be oxidation graded, continuously or discontinuously, so as to be more oxided farther from the organic light emitting layer.

In the OLED of any of the preceding three paragraphs, the transparent conductive electrode structure may further comprises a glass substrate, wherein the first portion is located between the glass substrate and the second portion.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making an electrode for use in an organic light emitting diode (OLED) device, the method comprising:
   sputter-depositing a first layer comprising indium tin oxide (ITO) on a glass substrate;
   sputter-depositing a second layer comprising ITO on the glass substrate over and directly contacting the first layer comprising ITO to form an electrode structure, so that the first layer comprising ITO is located between at least the substrate and the second layer comprising ITO in the electrode structure, wherein as sputter-deposited the first layer comprising ITO is more oxided than is the second layer comprising ITO; and
   heat treating the electrode structure including the glass substrate and the first and second layers comprising ITO at temperature(s) of at least about 400 degrees C. in order to increase work function of ITO in the electrode structure and increase visible transmission of the electrode structure.

2. The method of claim 1, wherein the first and second layers comprising ITO consist essentially of ITO.

3. The method of claim 1, wherein, as sputter-deposited, the first layer comprising ITO contains at least 5% more oxygen than does the second layer comprising ITO.

4. The method of claim 1, wherein, as sputter-deposited, the first layer comprising ITO contains at least 10% more oxygen than does the second layer comprising ITO.

5. The method of claim 1, wherein, as sputter-deposited, the first layer comprising ITO contains at least 20% more oxygen than does the second layer comprising ITO.

6. The method of claim 1, wherein, as sputter-deposited, the first layer comprising ITO contains at least 30% more oxygen than does the second layer comprising ITO.

7. The method of claim 1, wherein said heat treating comprises heat treating the electrode structure including the glass substrate and the first and second layers comprising ITO thereon at temperature(s) of at least about 500 degrees C.

8. The method of claim 1, wherein said heat treating comprises heat treating the electrode structure including the glass substrate and the first and second layers comprising ITO thereon at temperature(s) of at least about 550 degrees C.

9. The method of claim 1, wherein said sputter-depositing of the first layer comprising ITO and said sputter-depositing of the second layer comprising ITO each comprises sputter-depositing at approximately room temperature.

10. The method of claim 1, wherein said first layer comprising ITO is sputter-deposited on the glass substrate so as to directly contact the glass substrate.

11. The method of claim 1, wherein the first layer comprising ITO is thicker than the second layer comprising ITO.

12. The method of claim 1, wherein the first layer comprising ITO is at least 50 nm thicker than the second layer comprising ITO.

13. The method of claim 1, wherein said sputter-depositing of the first layer comprising ITO comprises sputtering a ceramic target comprising indium, tin and oxygen; and said sputter-depositing of the second layer comprising ITO comprises sputtering a metal target comprising indium and tin.

14. The method of claim 1, wherein the first layer comprising ITO is from about 100-200 nm thick.

15. The method of claim 1, wherein the second layer comprising ITO is from about 20-95 nm thick.

16. The method of claim 1, wherein after said heat treating the electrode structure has a visible transmission of at least about 80%.

17. The method of claim 1, further comprising, after said heat treating, providing the electrode structure in an OLED device so that an organic light emitting semiconductor layer is located between said electrode structure and another electrode.

18. A method of making an organic light emitting diode (OLED) device, the method comprising:
   sputter-depositing a first layer comprising indium tin oxide (ITO) on a glass substrate;
   sputter-depositing a second layer comprising ITO on the glass substrate over the first layer comprising ITO to form an electrode structure, so that the first layer comprising ITO is located between at least the substrate and the second layer comprising ITO in the electrode structure, wherein as sputter-deposited the first layer comprising ITO is more oxided than is the second layer comprising ITO;
   heat treating the electrode structure including the glass substrate and the first and second layers comprising ITO thereon at temperature(s) of at least about 500 degrees C. to increase work function of the electrode structure; and
   after said heat treating, providing the electrode structure in an OLED device so that an organic light emitting semiconductor layer of the OLED device is located between said electrode structure and another electrode.

19. The method of claim 18, where after said heat treating the electrode structure has a visible transmission of at least about 80%.

20. A method of making an electrode for use in an organic light emitting diode (OLED) device, the method comprising:
   sputter-depositing a first layer comprising metal oxide on a substrate;
   sputter-depositing a second layer comprising metal oxide on the substrate over and directly contacting the first layer comprising metal oxide to form an electrode structure, wherein the same metal oxide is in both the first and second layers comprising metal oxide, but as sputter-deposited the first layer comprising metal oxide is more oxided than is the second layer comprising metal oxide; and heat treating the electrode structure including the substrate and the first and second layers comprising metal oxide at temperature(s) of at least about 400 degrees C. in order to increase work function of ITO in the electrode structure and increase visible transmission of the electrode structure.

21. The method of claim 20, wherein the substrate comprises glass.

22. The method of claim 20, wherein the metal oxide comprises ITO.

23. An organic light emitting diode (OLED) comprising:
a transparent conductive electrode structure comprising first and second layers comprising the same metal oxide on a substrate, the first layer comprising the metal oxide being located between the substrate and the second layer comprising the metal oxide, and wherein the second layer comprising the metal oxide directly contacts the first layer comprising the metal oxide;
wherein the same metal oxide is in both the first and second layers comprising the metal oxide, and wherein the first layer comprising the metal oxide is more oxided than is the second layer comprising the metal oxide; and
an organic light emitting layer located between said transparent conductive electrode structure and another electrode, and wherein said transparent conductive electrode structure is on a light emitting side of the organic light emitting layer.

24. The OLED of claim 23, wherein the substrate comprises glass.

25. The OLED of claim 23, wherein the metal oxide comprises ITO.

26. The OLED of claim 23, wherein the first layer comprising the metal oxide contains at least 5% more oxygen than does the second layer comprising the metal oxide.

27. The OLED of claim 23, wherein the first layer comprising the metal oxide contains at least 10% more oxygen than does the second layer comprising the metal oxide.

28. An organic light emitting diode (OLED) comprising:
an organic light emitting layer located between a transparent conductive electrode structure and another electrode, and wherein said transparent conductive electrode structure is on a light emitting side of the organic light emitting layer; and
wherein said transparent conductive electrode structure includes a film comprising a metal oxide, wherein said film comprising the metal oxide includes a first portion and a second portion, the first portion being more oxided than the second portion and being farther from the organic light emitting layer than the second portion.

29. The OLED of claim 28, wherein the first portion contains at least 5% more oxygen than does the second portion.

30. The OLED of claim 28, wherein the first portion contains at least 10% more oxygen than does the second portion.

31. The OLED of claim 28, wherein the film comprising the metal oxide is oxidation graded so as to be more oxided farther from the organic light emitting layer.

32. The OLED of claim 28, wherein the transparent conductive electrode structure further comprises a glass substrate, wherein the first portion is located between the glass substrate and the second portion.

33. The OLED of claim 28, wherein the metal oxide is ITO.

* * * * *